United States Patent
Snell et al.

(10) Patent No.: US 11,601,103 B2
(45) Date of Patent: Mar. 7, 2023

(54) CHANNELISED GAIN CONTROL OF LINE AMPLIFIERS

(71) Applicant: RF Industries Pty Ltd, Seven Hills (AU)

(72) Inventors: Christopher John Snell, Seven Hills (AU); Gregory Steven Pope, Seven Hills (AU)

(73) Assignee: RF Industries Pty Ltd, Seven Hills (AU)

( * ) Notice: Subject to any disclaimer, the term of this patent is extended or adjusted under 35 U.S.C. 154(b) by 385 days.

(21) Appl. No.: 16/999,826

(22) Filed: Aug. 21, 2020

(65) Prior Publication Data
US 2021/0058048 A1 Feb. 25, 2021

(30) Foreign Application Priority Data
Aug. 23, 2019 (AU) .................. 2019903091

(51) Int. Cl.
*H03G 3/00* (2006.01)
*H01P 3/06* (2006.01)
*H01Q 13/20* (2006.01)

(52) U.S. Cl.
CPC ............. *H03G 3/005* (2013.01); *H01P 3/06* (2013.01); *H01Q 13/203* (2013.01)

(58) Field of Classification Search
CPC ......... H03G 3/005; H01P 3/06; H01Q 13/203
See application file for complete search history.

(56) References Cited

U.S. PATENT DOCUMENTS

| | | | |
|---|---|---|---|
| 3,835,393 A * | 9/1974 | Marron | H04N 7/173 370/293 |
| 5,802,173 A * | 9/1998 | Hamilton-Piercy | H04B 7/2609 379/56.2 |
| 10,499,253 B2 * | 12/2019 | Kummetz | H04W 88/085 |
| 2004/0131011 A1 * | 7/2004 | Sandell | H04L 27/261 370/208 |
| 2019/0342765 A1 * | 11/2019 | Pataky | H03F 3/19 |

* cited by examiner

*Primary Examiner* — Patricia T Nguyen
(74) *Attorney, Agent, or Firm* — Muncy, Geissler, Olds & Lowe, P.C.

(57) ABSTRACT

A method for controlling gain of a line amplifier on a cable, the method comprising selecting an unused carrier frequency; transmitting a pulsed pilot signal on the unused carrier frequency into the cable; determining a pilot signal output strength by measuring signal strength of the pilot signal after amplification by the line amplifier; comparing the pilot signal output strength with a target signal strength to determine a difference; and adjusting the gain of the line amplifier corresponding to the difference.

20 Claims, 3 Drawing Sheets

Line amplifier block diagram

Figure 1 – Typical Leaky Coaxial Cable Radio Network

Figure 2 – Line amplifier block diagram

CHANNELISED GAIN CONTROL OF LINE AMPLIFIERS

This nonprovisional application claims priority under 35 U.S.C. § 119(a) to Australian Patent Application No. 2019903091, which was filed in Australia on Aug. 23, 2019, and which is herein incorporated by reference.

FIELD OF THE INVENTION

The present invention relates to line amplifiers and in particular to line amplifiers on leaky feeders such as those used in mines and tunnels.

BACKGROUND TO THE INVENTION

Voice communications between workers deployed in tunnel-type environments, such as for example, underground mines, or tunnels being constructed for new transport infrastructure, are typically enabled by narrowband duplex radio networks, using either analogue or digital modulation schemes. These radio networks may typically operate in either the UHF or VHF spectrum bands; VHF being the most prevalent.

The radio communication transmissions (RF) are typically conveyed via a "leaky" coaxial cable or leaky feeder. That is, a coaxial cable with discontinuities in its outer shield. These discontinuities are usually in the form of regular slot openings along the length of the cable. Normally a coaxial cable is encased in a copper sheath to prevent leakage of the signal. The discontinuities, or slots, in the coaxial cable allow the RF signal to radiate into and out of the cable and so, the entire cable length acts as a single long antenna. This can create a limited wireless network environment allowing wireless devices in the tunnel to receive radio signals from the cable, and to also transmit radio signals back to the cable.

The radio network may be configured in many ways. In one arrangement, there may be a single high-powered duplex radio base station repeater, located at the beginning of the tunnel network, which is connected to the leaky coaxial cable using a suitable duplexer. The base station is configured with transmit and receive RF frequencies that are different to each other in order to enable duplex operation.

Mobile transceivers or portables (subscriber units—SU's) are configured such that their transmit frequencies equal the base station receive frequency, and their receive frequencies equal the base station transmit frequency. In this manner, the SU's communicate with each other via the base station repeater over the leaky coaxial cable. Such a network provides a single voice channel for use by the SU's.

In another arrangement, there may be multiple base station repeaters on different frequencies operating collectively into a single leaky coaxial cable, thereby providing multiple voice channels for simultaneous use by multiple SU's.

A limitation of leaky cables is that the RF signal intensity within the leaky coaxial cable decreases as it travels away from the feed point at the base station repeater. This is due to transmission and cable losses. The converse is also true in that any RF signals picked up by the leaky coaxial cable from SU's in the tunnel areas also decrease in intensity as they travel along the cable back to the base station repeater. Signals would become unusable over long cable lengths without any amplification.

Therefore, line amplifiers are utilised to compensate for these losses, with multiple units deployed at regular intervals along the entire length of the leaky coaxial cable. The line amplifiers boost the signal to compensate for the signal loss along the line and maintain the radiated signal strength along the length of the cable. The separation between line amplifiers is governed by both the line amplifier gain and the loss in the cable. The typical separation between adjacent line amplifiers may vary from 350 metres to 500 metres. The line amplifiers must be able to amplify RF signals travelling in both directions independently; that is, in both the uplink and downlink directions.

Leaky coaxial cable networks including line amplifiers have proven to be successful in underground tunnel deployments, particularly in the mining industry, due to the ease with which they are deployed, maintained, and extended as the tunnel network develops and expands. The cable can be laid as the tunnel is excavated, and there is no issue with laying the cable around corners, or down access holes. Splitters can also be used if a tunnel branches into two tunnels, or a side tunnel is created. These advantages allow the network to continually expand as the mine or tunnel network expands.

Line Amplifier Gain Control

The line amplifiers are broadband meaning that they are able to amplify multiple voice channels simultaneously at frequencies falling within their operational bandwidths. The level of any individual channel's output signal, in linear terms, is equal to the level of the channel's input signal multiplied by the linear gain of the line amplifier. The line amplifier's composite output power level, which represents the total sum output power of all the individual amplified voice channel signals, needs to be kept at a constant value well below the maximum permissible output power level. This is to ensure that the output amplifier stages are not overdriven, which could lead to intermodulation interference or amplifier failure, and that the maximum input power level to the next line amplifier in the chain is not exceeded. The voice channel output signal level also needs to be high enough to provide adequate radio coverage.

As such, the level of the line amplifier's RF signal gain in both the uplink and downlink directions needs to be carefully monitored and adjusted. This can be quite a challenge since tunnel networks can be extremely long (up to 100 km in some cases), and hence will comprise hundreds of cascaded line amplifiers.

The earliest leaky coaxial cable networks relied on individual manual gain control of each line amplifier, whereas current state-of-the-art line amplifiers utilise an automatic gain control (AGC) topology. Both methods have significant drawbacks, which are described below.

Manual Gain Control

Line amplifiers equipped only with manual gain control have a set of controls that allow the net RF signal gain of the amplifier to be adjusted. Similar controls are provided individually in both the uplink and downlink amplifier paths. Whilst this approach is extremely simple, it has the following disadvantages:

The gain setting is subject to human error, particularly in underground mining deployments where technicians are not equipped with advanced test equipment due to the nature of the environment;

The individual gain settings need to be adjusted each time changes are made to the network, due to, for example, cable repairs, addition of line splitters (cable branches), and/or network extensions. The individual line amplifiers are typically installed high up the tunnel walls or on the tunnel roof, meaning that access to them is extremely difficult. As a result, the gain adjustments are often overlooked, leading to a degradation and possible failure of the radio network with major health and safety consequences.

Automatic Gain Control (AGC)

Line amplifiers equipped with AGC utilise a feedback loop to automatically adjust their signal gain in order to set the composite output power level to a pre-determined value. The output signal is sampled to measure the composite output power level, and a feedback signal is generated which then adjusts the gain; the loop is reiterated until the desired composite output power level is attained. In some arrangements, a typical composite output power level target would be 0 dBm (in logarithmic terms).

This adjustment relies on the constant presence of at least one input signal to drive the line amplifier, which, if the presence of this signal was solely reliant on voice channel activity, could not be guaranteed. For this reason, a continuous pilot signal is transmitted along the leaky coaxial cable network from equipment located at the tunnel headend, which then allows the line amplifier to adjust its composite output power level accordingly.

However, if there are active voice channels, the composite output power of the line amplifier includes the sum of the power levels of each individual active voice channel signal, as well as the output power level of the pilot signal. Whilst this approach overcomes the disadvantages of manual gain control, it has its own disadvantages:

The gain of the line amplifier fluctuates depending on the number of active voice channels at any one time. The gain is compromised when more voice channels are present due to the increased composite output power, meaning that the range of the radio network is compromised compared to what it would be if say a single voice channel was active;

A significant portion of the maximum composite output power of the line amplifier is consumed by the amplified pilot signal, which could otherwise be available for voice channels.

There is thus a need for alternative operation of line amplifiers to limit the disadvantages of both manual gain control and AGC.

SUMMARY OF THE INVENTION

In a broad form, there is provided a gain control system which feeds a pilot signal in pulses on an unused channel frequency into a cable to facilitate the adjustment of the gain control on an amplifier. The pulse interval can be random or regular.

In a first aspect, there is provided a method for controlling gain of a line amplifier on a cable, the method comprising:
selecting an unused carrier frequency;
transmitting at regular intervals a pilot signal on the unused carrier frequency into the cable;
determining a pilot signal output strength by measuring signal strength of the pilot signal after amplification by the line amplifier;
comparing the pilot signal output strength with a target signal strength to determine a difference; and
adjusting the gain of the line amplifier corresponding to the difference.

In an embodiment, the pilot signal is encoded with the target signal strength.

In an embodiment, the method further comprises decoding the amplified pilot signal in order to determine the target signal strength.

In an embodiment, the gain of the line amplifier is adjusted such that a level of the pilot signal is lower than any voice channel signals.

In an embodiment, the level of the pilot signal is around 15 dB to 20 dB lower than the voice channel signals.

In an embodiment, the gain of the line amplifier is adjusted automatically in response to determining the difference.

In an embodiment, the gain of the line amplifier is adjusted repeatedly until a determination that there is no difference between the target signal strength and the pilot signal output strength of the amplified pilot signal.

In an embodiment, the gain of the line amplifier is adjusted incrementally.

In an embodiment, the unused carrier frequency is selected from a list of unused voice channel frequencies.

In another aspect the present invention provides a line amplifier gain control system comprising:
a cable;
an amplifier on the cable;
a pilot signal generator for generating a pulsed pilot signal on an unused channel frequency;
headend equipment for feeding signals into the cable, the headend equipment combining the pilot signal and voice channels into a combined signal, and feeding the combined signal into the cable;
a controller for determining a pilot signal output strength by measuring signal strength of the pilot signal after amplification by the amplifier, comparing the pilot signal output strength with a target signal strength to determine a difference, and adjusting the gain of the amplifier corresponding to the difference.

In an embodiment, the pilot signal is encoded with the target signal strength by the pilot signal generator.

In an embodiment, the controller is configured to determine the target signal strength by decoding the amplified pilot signal.

In an embodiment, the gain of the amplifier is adjusted by the controller such that a level of the pilot signal is lower than any voice channel signals.

In an embodiment, the level of the pilot signal is around 15 dB to 20 dB lower than the voice channel signals.

In an embodiment, the gain of the amplifier is adjusted automatically by the controller in response to the controller determining the difference.

In an embodiment, the gain of the amplifier is adjusted repeatedly by the controller until the controller determines no difference between the target signal strength and the pilot signal output strength of the amplified pilot signal.

In an embodiment, the gain of the amplifier is adjusted incrementally.

In an embodiment, the unused carrier frequency is selected from a list of unused voice channel frequencies by the pilot signal generator.

In an embodiment, the headend equipment is configured to receive the voice channels from at least one voice repeater, and the pulsed pilot signal from the pilot signal generator.

In a further aspect, the present invention provides a line amplifier comprising:
a downlink amplifier adapted to receive a composite signal, the composite signal comprising at least one voice channel and a pulsed pilot signal, the pilot signal comprising a target signal level, and the downlink amplifier amplifying the composite signal into an amplified signal;

a sampler to determine an output level of the pilot signal in the amplified signal;

a filter to extract the target signal level from the composite signal;

a processor to compare the target signal level and the output level, and adjust gain control of the downlink amplifier corresponding to a difference between the target signal level and the output level.

In another aspect the present invention provides a headend apparatus adapted to receive at least one voice channel from at least one voice repeater, and a pulsed pilot signal from a pilot signal generator, said pilot signal being encoded with a target signal level, said headend apparatus combining each said at least one voice channel and said pilot signal into a composite signal, and feeding said composite signal into a cable.

BRIEF DESCRIPTION OF THE DRAWINGS

An illustrative embodiment of the present invention will now be described with reference to the accompanying figures. Further features and advantages of the invention will also become apparent from the accompanying description.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
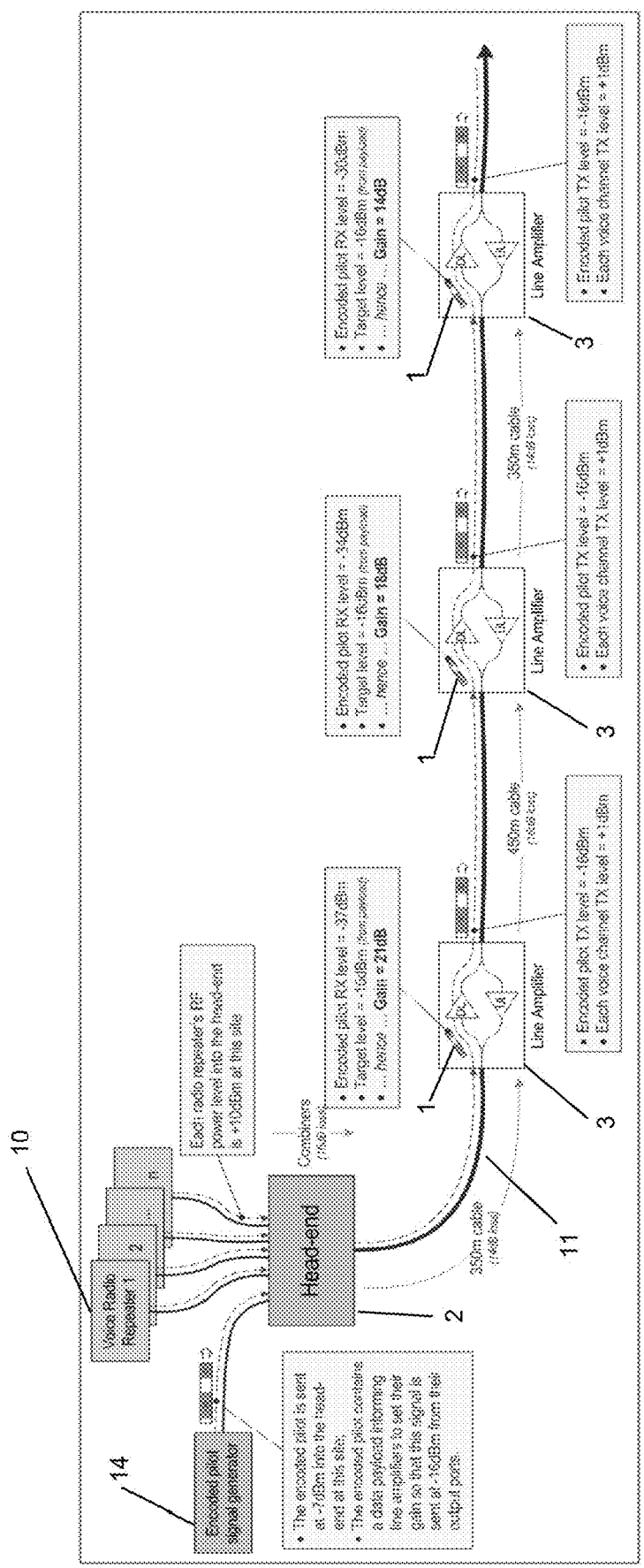
FIG. 1 shows an example leaky coaxial cable radio network deployment.

The invention describes a novel approach to achieving line amplifier gain control without the disadvantages of both manual and traditional automatic gain control techniques. The following description refers to improvements to a typical leaky coaxial cable radio network deployment as depicted in FIG. 1.

In a preferred embodiment, a low-level downlink encoded pilot signal 1 is transmitted into the leaky coaxial cable 11 network from equipment located at the tunnel headend 2. The carrier frequency of the downlink encoded pilot signal is selected from a list of unused voice channel frequencies such that any potential interference issues are mitigated.

Ideally, the level of the downlink encoded pilot signal would be around 15 dB to 20 dB lower than the voice channel signals. The low-level downlink encoded pilot signal 1 allows more efficient utilisation of the line amplifier's maximum composite output power by the voice channels. While the system could work if the pilot signal strength was the same or higher than the voice signal strength, it would be using more of the available composite power for the pilot signal than necessary, hence reducing the maximum signal level output of the voice channels. A 15 dB difference effectively means the pilot signal level is around $\frac{1}{32}^{th}$ of the voice signal level; and a 20 dB difference translates to around a $\frac{1}{100}^{th}$ reduction. By adopting these lower levels, a greater amount of the maximum composite power output of the amplifier can be utilised primarily for the voice channels, with only a fraction needed for the pilot signal. The level of the pilot signal is insignificant compared to the level of the voice signals, meaning that the composite output power level in decibels is easily calculated since it will increase at the rate of 20*Log(N), where N is the number of voice channels.

The downlink encoded pilot signal 1 is repeatedly transmitted in pulses rather than being transmitted continuously. The timing of the pulse transmission may be at a predetermined regular interval. In this way the installation knows that the gain control is adjusted or reviewed on the selected timing. In an alternative arrangement variable timing could be applied. In this arrangement, the pulses could be transmitted rapidly when a network is originally set up. This allows the gain control to be adjusted to the correct levels in a short period of time. After an initial set up period the frequency of the pulses could be reduced as the system only needs to maintain the correct gain control. In a further option, the timing interval could be decreased if there are changes to the network, or gain control adjustments are necessary.

The downlink encoded pilot signal 1 could contain encoded data messages. In a preferred embodiment, these messages could contain:

A signature that allows each line amplifier to identify the encoded pilot as a valid encoded pilot.

The target signal level of the encoded pilot signal at the output of the line amplifier;

Pilot signal frequency information.

Figure 2:
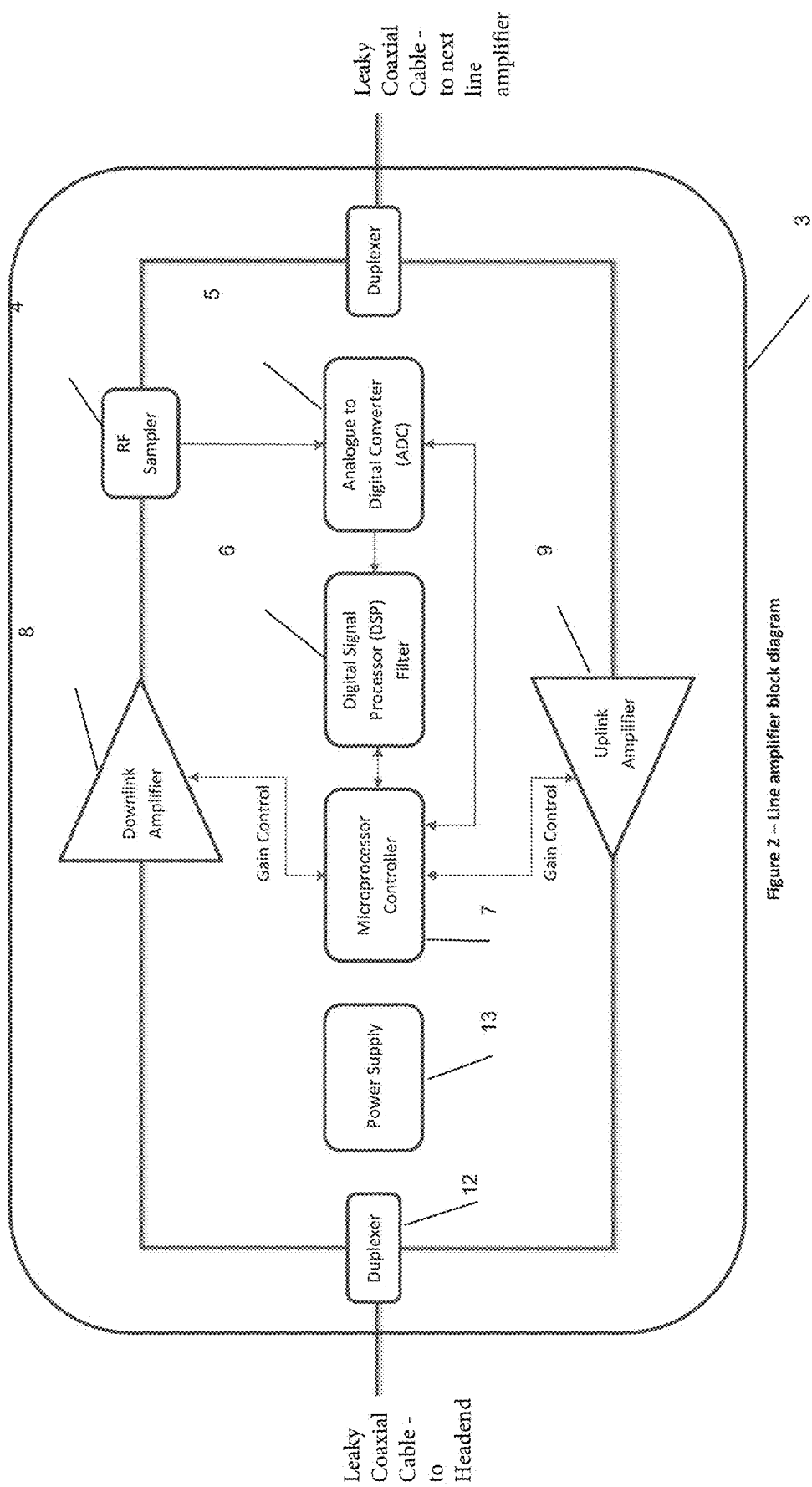
FIG. 2 shows an example block diagram of a line amplifier layout.

In this arrangement each line amplifier 3 in the network is fitted with electronic circuitry to extract the downlink encoded pilot signal 1. A block diagram of a representative line amplifier layout is shown in FIG. 2. In a preferred embodiment, the composite analogue signals at the output of the line amplifier are sampled 4. This could be by using the coupled port of an RF directional coupler with a 20 dB coupling ratio. The sampled composite signals are then converted to composite digital signals via an analogue to digital converter (ADC) 5. This composite digital signal is then processed by a digital signal processor (DSP) 6, to channelize all of the active channels on the network, including the downlink encoded pilot signal. The downlink encoded pilot signal can be extracted from the composite digital signal by passing the signal through a digital bandpass filter tuned to the pilot signal frequency. The digital bandpass filter is established using digital filtering techniques. The actual signal level of the extracted downlink encoded pilot signal ("filteredEncodedpilotRSSI") is then computed using a microprocessor 7 to measure the signal amplitude.

The extracted downlink encoded pilot signal is also demodulated in order to extract the encoded data messages. If the downlink encoded pilot is a valid encoded pilot, the target signal level of the downlink encoded pilot signal ("targetRSSI") is read from the encoded messages. In one embodiment the encoded data contains a signature, comprising a data payload sequence frame with synchronisation and Frame Check Sequence bits, in order to check for data errors. If there are no data errors, the downlink encoded pilot is deemed to be valid. If a valid downlink encoded pilot signal is not found, the line amplifier gain could revert to the last gain value that was able to be determined dynamically, or if this does not exist (such as in a new installation for example), a hard-coded fallback gain value could be relied on.

The "filteredEncodedpilotRSSI" value is compared to the "targetRSSI" value. The targetRSSI is set so as to achieve a downlink voice channel signal output power level target; say 0 dBm. The composite output power is equal to the sum of the output power level of each individual voice channel and encoded pilot signal and as such is proportional to the number of voice channels. The maximum tolerable composite output power level will be a constant that has been determined by the power rating of the amplifier output devices and the intermodulation levels that can be tolerated within the radio network, therefore, the voice channel signal output targetRSSI level can be adjusted depending on the number of voice channels in the radio network; higher when there are a smaller number of channels and vice-versa.

The difference between the "filteredEncodedpilotRSSI" value and the "targetRSSI" value dictates the required downlink gain adjustment of the line amplifier. The downlink gain of the line amplifier is adjusted incrementally by the microprocessor, and the process repeats until the "filteredEncodedpilotRSSI" value is substantially equal to the "targetRSSI" value. In some applications, a tolerance or small difference between the "filteredEncodedpilotRSSI" value and the "targetRSSI" value could be ignored. That is, below a certain difference the gain may not be adjusted. A possible tolerance of +/−1 dB could be applied.

The uplink gain may be set to equal the final downlink gain setting plus any predetermined offset that may be deemed necessary. For example, as the uplink voice channels operate in a different frequency band to the downlink voice channels in a duplex network, the leaky coaxial cable will have different loss characteristics at different frequency bands; the offset can compensate this loss difference by adjusting the uplink gains accordingly in order to achieve a balanced performance in both the uplink and downlink paths. It is expected that the offset could range between 0 dB and 3 dB.

It is preferred that the "filteredEncodedpilotRSSI" and "targetRSSI" values continue to be monitored on a regular basis to ensure that the downlink and uplink gains of the line amplifier are always set correctly in case either of the two variables change.

This method of gain adjustment ensures that the gain setting remains stable regardless of the number of voice channels that are operating at any one time, or any changes in the network, such as for example, adding a splitter into the cable.

Figure 3:
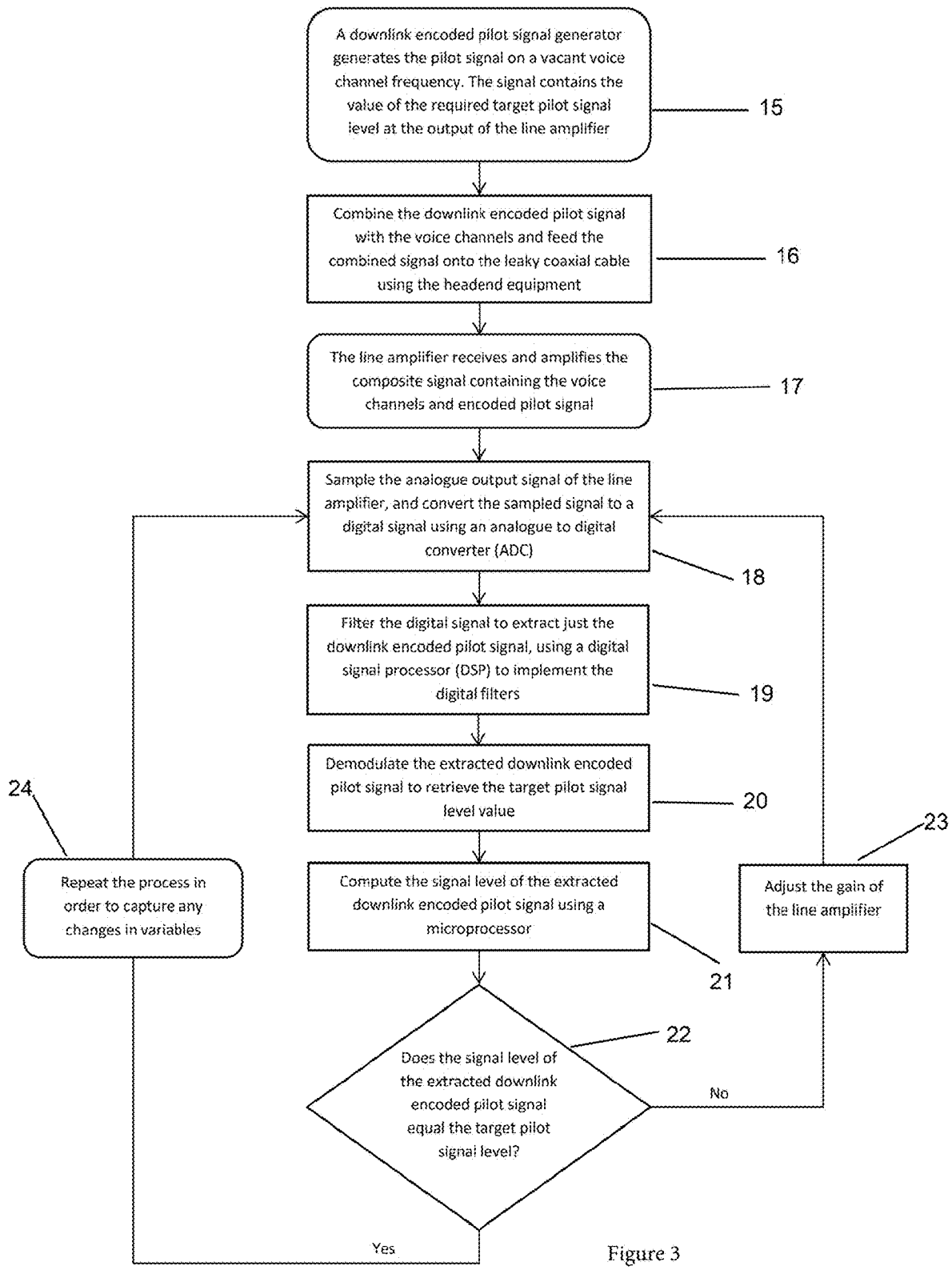
FIG. 3 shows an example flow chart of the process in one embodiment of the present invention.

The process can be seen in FIG. 3, which sets out one embodiment of the present invention.

A downlink encoded pilot signal generator 14 generates 15 the pilot signal 1 on a vacant voice channel frequency. The signal ideally contains the value of the required target pilot signal level at the output of the line amplifiers 3, and can also include data to enable to enable the signal to be verified.

The downlink encoded pilot signal 1 is then combined 16 with the voice channels at the headend equipment 2. The headend equipment 2 will also receive voice radio repeater channels 10 that are to be transmitted into the tunnel. The headend equipment will then feed the combined signal onto the leaky coaxial cable 11. In effect this will transmit the channels into the tunnel.

The line amplifier 3 receives 17 the composite signal containing the voice channels and encoded pilot signal for amplification.

The signal from the downlink amplifier 8 passes through an RF sampler 4. The sampler 4 samples 18 the analogue output signal of the downlink amplifier 8, which is also in effect the output of the line amplifier 3. The sampled signal is then converted to a digital signal using an analogue to digital converter (ADC) 5.

The digital signal from the ADC 5 is then filtered 19 using a digital signal processor (DSP) 6 to extract the downlink encoded pilot signal 1.

The extracted downlink encoded pilot signal can then be demodulated 20 to retrieve the target pilot signal level value.

The microprocessor controller 7 computes 21 the signal level of the extracted downlink encoded pilot signal, so that it can be compared 22 to the target level.

If the signal level of the downlink signal is not equal to the target level, the microprocessor controller 7 will adjust 23 the gain control of the downlink amplifier 8. After the gain control is adjusted the output signal of the downlink amplifier 8 will again be sampled 18, and the process repeats to ensure the gain control is correctly adjusted.

Once the signal level of the downlink signal is equal to the target level, then the sampling, comparing and adjusting process is repeated 24. That is, the output signal of the downlink amplifier 8 is sampled 18, and the process of steps 18 to 22 repeated. The continual repeating of steps 18 to 22, and then steps 23 or 24, allows the system to capture any changes in variables. For example, if the cable was extended or split, or to amplifier gain changes resulting from temperature variations Alternative Embodiment In an alternative embodiment, a secondary encoded pilot signal is established at a different carrier frequency to be used in the uplink direction. The uplink encoded pilot signal may be sent by any individual line amplifier back to the headend equipment.

The uplink encoded pilot signal can contain encoded data messages. In a preferred embodiment these messages contain:
A signature that identifies the individual line amplifier sending the encoded pilot signal;
Diagnostic information pertaining to the line amplifier that has sent the encoded pilot signal;
The value of the "filteredEncodedpilotRSSI" variable.
The downlink encoded pilot signal in this instance contains the following encoded data messages:
A signature that allows each line amplifier to identify the encoded pilot as a valid encoded pilot;
A signature that identifies an individual, group, or all of the line amplifiers in the network;
An incremental sequence number that wraps.

The line amplifiers monitor the downlink encoded pilot signal in the same manner as in the previous embodiment; in this case however, only the "filteredEncodedpilotRSSI" value is computed. The sequence number is also decoded.

Each line amplifier sends an uplink encoded pilot signal back to the headend equipment depending on the value of the sequence number. This ensures that only one line amplifier sends an uplink encoded pilot signal at any one time.

The uplink encoded pilots are processed and decoded by a microprocessor in the headend equipment. The value of the "filteredEncodedpilotRSSI" variable that has been reported by the line amplifier that has sent the uplink encoded pilot signal is compared to the value of the "targetRSSI" variable stored in the headend equipment memory. The difference between these two values determines the new value of the downlink gain setting for the line amplifier. This value is reported back to the line amplifier using its unique identifying signature in a separate downlink encoded pilot signal which contains additional encoded data specifying the downlink gain value.

While the present embodiment has been described in the context of underground mines, a person skilled in the art will appreciate that the invention could be used for many different applications in many environments. For example, during the construction of underground transport infrastructure. The invention may also have application in emergency situations whereby it is necessary to roll out an effective communication network at short notice, such as for example, a cave rescue.

Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment.

Moreover, in interpreting the disclosure, all terms should be interpreted in the broadest reasonable manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

In this specification, terms such as 'transmitter, 'receiver', 'base station', 'processor', and so forth, unless otherwise required by the context, should be understood as referring to a range of possible implementations of devices, apparatus and systems comprising a combination of hardware and software.

Furthermore, the particular features, structures, or characteristics may be combined in any suitable manner in one or more combinations. It will be appreciated that persons skilled in the art could implement the present invention in different ways to the one described above, and variations may be produced without departing from its spirit and scope.

Any discussion of documents, devices, acts or knowledge in this specification is included to explain the context of the invention. It should not be taken as an admission that any of the material forms part of the prior art base or the common general knowledge in the relevant art, in any country, on or before the filing date of the patent application to which the present specification pertains.

What is claimed is:

1. A method for controlling gain of a line amplifier on a cable, the method comprising:
    selecting an unused carrier frequency;
    transmitting a pulsed pilot signal on said unused carrier frequency into said cable;
    determining a pilot signal output strength by measuring signal strength of said pilot signal after amplification by said line amplifier;
    comparing the pilot signal output strength with a target signal strength to determine a difference; and
    adjusting the gain of said line amplifier corresponding to said difference.

2. A method as claimed in claim 1, wherein the pilot signal is encoded with the target signal strength.

3. A method as claimed in claim 1, further comprising decoding the amplified pilot signal in order to determine the target signal strength.

4. A method as claimed in claim 1, wherein the gain of the line amplifier is adjusted such that a level of the pilot signal is lower than any voice channel signals.

5. A method as claimed in claim 4, wherein the level of the pilot signal is around 15 dB to 20 dB lower than the voice channel signals.

6. A method as claimed in claim 4, wherein the gain of the line amplifier is adjusted automatically in response to determining the difference.

7. A method as claimed in claim 6, wherein the gain of the line amplifier is adjusted repeatedly until a determination that there is no difference between the target signal strength and the pilot signal output strength of the amplified pilot signal.

8. A method as claimed in claim 7, wherein the gain of the line amplifier is adjusted incrementally.

9. A method as claimed in claim 1, wherein the unused carrier frequency is selected from a list of unused voice channel frequencies.

10. A line amplifier gain control system, comprising:
    a cable;
    an amplifier on said cable;
    a pilot signal generator for generating a pulsed pilot signal on an unused channel frequency;
    headend equipment for feeding signals into said cable, said headend equipment combining said pilot signal and voice channels into a combined signal, and feeding said combined signal into said cable; and
    a controller for determining a pilot signal output strength by measuring signal strength of said pilot signal after amplification by said amplifier, comparing the pilot signal output strength with a target signal strength to determine a difference, and adjusting the gain of said amplifier corresponding to said difference.

11. A system as claimed in claim 10, wherein the pilot signal is encoded with the target signal strength by the pilot signal generator.

12. A system as claimed in claim 10, wherein the controller is configured to determine the target signal strength by decoding the amplified pilot signal.

13. A system as claimed in claim 10, wherein the gain of the amplifier is adjusted by the controller such that a level of the pilot signal is lower than any voice channel signals.

14. A system as claimed in claim 13, wherein the level of the pilot signal is around 15 dB to 20 dB lower than the voice channel signals.

15. A system as claimed in claim 13, wherein the gain of the amplifier is adjusted automatically by the controller in response to the controller determining the difference.

16. A system as claimed in claim 15, wherein the gain of the amplifier is adjusted repeatedly by the controller until the controller determines no difference between the target signal strength and the pilot signal output strength of the amplified pilot signal.

17. A system as claimed in claim 16, wherein the gain of the amplifier is adjusted incrementally.

18. A system as claimed in claim 10, wherein the unused carrier frequency is selected from a list of unused voice channel frequencies by the pilot signal generator.

19. A system as claimed in claim 10, wherein the headend equipment is configured to receive the voice channels from at least one voice repeater, and the pulsed pilot signal from the pilot signal generator.

20. A line amplifier comprising:
    a downlink amplifier adapted to receive a composite signal, said composite signal comprising at least one voice channel and a pulsed pilot signal, said pilot signal comprising a target signal level, and said downlink amplifier amplifying said composite signal into an amplified signal;

a sampler to determine an output level of said pilot signal in said amplified signal;

a filter to extract said target signal level from said composite signal; and a processor to compare said target signal level and said output level, and adjust gain control of said downlink amplifier corresponding to a difference between said target signal level and said output level.

\* \* \* \* \*